US012198969B2

(12) United States Patent
Lee

(10) Patent No.: US 12,198,969 B2
(45) Date of Patent: Jan. 14, 2025

(54) CONDUCTIVE ELECTROSTATIC CHUCK LIFT PIN, ELECTROSTATIC CHUCK COMPRISING THE SAME, AND SEMICONDUCTOR MANUFACTURING METHOD USING THE SAME

(71) Applicant: Joon Ho Lee, Daejeon (KR)

(72) Inventor: Joon Ho Lee, Daejeon (KR)

( * ) Notice: Subject to any disclaimer, the term of this patent is extended or adjusted under 35 U.S.C. 154(b) by 201 days.

(21) Appl. No.: 18/016,221

(22) PCT Filed: Jun. 21, 2021

(86) PCT No.: PCT/KR2021/007713
§ 371 (c)(1),
(2) Date: Jan. 13, 2023

(87) PCT Pub. No.: WO2022/019487
PCT Pub. Date: Jan. 27, 2022

(65) Prior Publication Data
US 2023/0282507 A1    Sep. 7, 2023

(30) Foreign Application Priority Data
Jul. 24, 2020    (KR) .................. 10-2020-0092081

(51) Int. Cl.
*H01L 21/683*    (2006.01)
(52) U.S. Cl.
CPC ................. *H01L 21/6833* (2013.01)
(58) Field of Classification Search
CPC ........... H01L 21/6833; H01L 21/68742; H01L 21/68757; B23Q 3/15; H02N 13/00
(Continued)

(56) References Cited

U.S. PATENT DOCUMENTS

| 5,900,062 A * | 5/1999 | Loewenhardt ...... H01L 21/6831 |
| | | 307/130 |
| 7,292,428 B2 * | 11/2007 | Hanawa .............. H01L 21/6831 |
| | | 361/234 |
| 2007/0297118 A1 * | 12/2007 | Fujii ...................... H02N 13/00 |
| | | 361/234 |

FOREIGN PATENT DOCUMENTS

| KR | 10-2002-0036299 A | 5/2002 |
| KR | 10-2004-0040103 A | 5/2004 |

(Continued)

OTHER PUBLICATIONS

N. Selvakumar, M. Sivaraj, S. Muthuraman, Microstructure characterization and thermal properties of Al—TiC sintered nano composites, Applied Thermal Engineering, vol. 107, 2016, pp. 625-632, ISSN 1359-4311, https://doi.org/10.1016/j.applthermaleng.2016.07.005 (Year: 2016).*

(Continued)

*Primary Examiner* — Thienvu V Tran
*Assistant Examiner* — Sreeya Sreevatsa
(74) *Attorney, Agent, or Firm* — Tutunjian & Bitetto, P.C.

(57) ABSTRACT

The present invention relates to a conductive lift pin used in an electrostatic chuck, an electrostatic chuck including same, and a semiconductor manufacturing method using same. Provided in the present invention are a conductive electrostatic chuck lift pin and an electrostatic chuck having the lift pin mounted therein, the lift pin including AlTiC, which has a TiC phase dispersed on an $Al_2O_3$ phase, and having electrical resistivity of $2.5 \times 10^{-5}$ to $3.5 \times 10^{-5}$ Ω·m. The electrostatic chuck lift pin of the present invention can solve the problem of defects induced by static electricity and electric reaction due to contact between the components and insulating ceramic when using existing insulating ceramic, and is conductive and thus can release residual charge between a semiconductor wafer and the electrostatic chuck (Continued)

even without the presence of plasma. Therefore, since the lift pin can be raised immediately after de-chucking, treatment time per wafer sheet is reduced.

5 Claims, 4 Drawing Sheets

(58) Field of Classification Search
USPC .......................................................... 361/222
See application file for complete search history.

(56) References Cited

FOREIGN PATENT DOCUMENTS

| KR | 10-2005-0026385 A | | 3/2005 |
|---|---|---|---|
| KR | 10-2006-0077667 A | | 7/2006 |
| KR | 20060077667 A | * | 7/2006 |
| KR | 10-2007-0043456 A | | 4/2007 |
| KR | 10-2009-0019414 A | | 2/2009 |
| KR | 10-2009-0020031 A | | 2/2009 |
| KR | 10-2011-0040508 A | | 4/2011 |
| KR | 10-2016-0135431 A | | 11/2016 |
| KR | 10-2234220 B1 | | 3/2021 |

OTHER PUBLICATIONS

Gao YY, Qiu F, Liu TS, Chu JG, Zhao QL, Jiang QC. Effects of Carbon Source on TiC Particles' Distribution, Tensile, and Abrasive Wear Properties of In Situ TiC/Al—Cu Nanocomposites Prepared in the Al—Ti—C System. Nanomaterials (Basel). Aug. 10, 2018;8(8): 610. doi: 10.3390/nano8080610. PMID: 30103408; (Year: 2018).*
International Search Report for PCT/KR2021/007713 dated Sep. 27, 2021, 3 pgs.

* cited by examiner

In case of SiC

In case of Al₂O₃

De-chuck Sequence

CONDUCTIVE ELECTROSTATIC CHUCK LIFT PIN, ELECTROSTATIC CHUCK COMPRISING THE SAME, AND SEMICONDUCTOR MANUFACTURING METHOD USING THE SAME

TECHNICAL FIELD

The present invention relates to a conductive lift pin used in an electrostatic chuck, an electrostatic chuck comprising the same, and a semiconductor manufacturing method using the same.

BACKGROUND ART

An electrostatic chuck (ESC) serves to fix a semiconductor wafer using electrostatic force in a vacuum process of manufacturing the semiconductor wafer during manufacturing of semiconductors. Electrostatic chuck lift pins, which are components used to transfer the wafer in the vacuum process of manufacturing the semiconductor wafer, are mounted as system components in the electrostatic chuck on which the wafer is placed in a vacuum treatment chamber, and are responsible for vertically moving the wafer. In order to stably vertically move the wafer, three or four electrostatic chuck lift pins are used as the system components which are mounted in the electrostatic chuck (ESC) FIG. 2 illustrates a process of vertically moving a semiconductor wafer by lift pins mounted in an electrostatic chuck.

The electrostatic chuck lift pins not only serve to mechanically vertically move the wafer, but also are connected to ground in a vacuum and thus serve to release residual charges (current) generated while chucking/de-chucking the wafer on/from the electrostatic chuck (ESC). FIG. 3 illustrates a process of releasing electric charges between the semiconductor wafer and the electrostatic chuck by the lift pins.

A semiconductor FAB, i.e., semiconductor fabrication plant, requires high-priced equipment and expensive maintenance, and thus, it is very important to reduce costs. In the semiconductor FAB using the electrostatic chuck, a de-chucking sequence is essential to separate a wafer from the electrostatic chuck. Here, productivity may be greatly improved by minimizing a de-chuck time.

In a bipolar-type ESC, when lift pins having a constant resistance are used, the lift pins may be raised immediately after the de-chucking process has been terminated.

Electrostatic chuck lift pins are generally made of a conductive material so as to release residual charges, but may use a ceramic material, which is non-conductive, in consideration of reaction with the ESC, influence on wafers, gas reaction, etc.

Representative materials used in the electrostatic chuck lift pins are SiC and $Al_2O_3$.

At the beginning, electrostatic chuck lift pins made of SiC having resistivity similar to those of semiconductors were used. SiC is a conductive material having resistivity greater than $10^4$ Ω·m, and is used as a material for electrostatic chuck lift pins which may easily remove residual charges during de-chucking using the electrostatic chuck lift pins. In order to refresh the atmosphere of the vacuum treatment chamber between treatment of a wafer and treatment of a next wafer manufactured in the vacuum treatment chamber, a plasma cleaning sequence is executed without any wafers. Here, when the SiC lift pins exposed to plasma using $SF_6$ gas react with fluorine (F) in dry plasma, SiC is rapidly etched by strong coupling reaction of SiF, and thus, a dry poly etcher process mainly using $SF_6$ gas is difficult to use due to a problem in plasma resistance. FIG. 4 illustrates such a problem in plasma resistance of the electrostatic chuck lift pins made of SiC.

$Al_2O_3$ is a non-conductive material having resistivity greater than $10^{12}$ Ω·m and strong plasma resistance and corrosion resistance, and is used as a material for electrostatic chuck lift pins. Use of $Al_2O_3$ as a material for electrostatic chuck lift pins may solve the above problem due to etching, but $Al_2O_3$, which is non-conductive, does not remove residual charges through electrostatic chuck lift pins during de-chucking and thus requires de-chucking of wafers using plasma discharge. In order to perform plasma de-chucking, after chucking voltage is turned off, a plasma discharge time of about 5 seconds is added, and thus, an additional treatment time of about 5 seconds is incurred per wafer, thereby having a negative influence on an output. FIG. 5 illustrates such a problem in plasma de-chucking of the electrostatic chuck lift pins made of $Al_2O_3$.

Like this, SiC is vulnerable to plasma using $SF_6$ gas and is thus difficult to use, and $Al_2O_3$, which is non-conductive, requires de-chucking using plasma discharge and thus has a negative influence on an output due to a long wafer treatment time.

Therefore, development of a conductive ceramic material, which is not vulnerable to plasma so as to be used in electrostatic chuck lift pins, is required.

RELATED DOCUMENT

Patent Document (Patent Document 1) Korean Patent Laid-open Publication No. 10-2011-0040508
(Patent Document 2) Korean Patent Laid-open Publication No. 10-2007-0043456
(Patent Document 3) Korean Patent Laid-open Publication No. 10-2009-0020031
(Patent Document 4) Korean Patent Laid-open Publication No. 10-2009-0019414
(Patent Document 5) Korean Patent Laid-open Publication No. 10-2016-0135431

SUMMARY OF THE INVENTION

Therefore, the present invention has been made in view of the above problems, and it is an object of the present invention to provide an electrostatic chuck lift pin which is conductive so as to release residual charges and has plasma resistance so as not to be etched using plasma.

It is another object of the present invention to provide a conductive electrostatic chuck lift pin which does not cause electrostatic and electrical reactions with an electrostatic chuck (ESC) or a wafer and does not affect other components.

It is a further object of the present invention to provide a provide an electrostatic chuck in which the electrostatic chuck lift pin is mounted, and a semiconductor manufacturing method using the same which greatly increases productivity.

Technical Solution

In accordance with the present invention,
the above and other objects can be accomplished by the provision of a conductive electrostatic chuck lift pin including AlTiC configured such that a TiC phase is dispersed on an $Al_2O_3$ phase in a weight ratio of 40-80:20-60 of $Al_2O_3$:TiC, and having electrical resistivity of $2.5\times10^{-5}$ to $3.5\times10^{-5}$ $\Omega \cdot m$. The electrical resistivity of the conductive electrostatic chuck lift pin may be $3\times10^{-5}$ $\Omega \cdot m$.

Further, in accordance with another aspect of the present invention, there is provided an electrostatic chuck including the conductive electrostatic chuck lift pin mounted therein.

Further, in accordance with a further aspect of the present invention, there is provided a semiconductor manufacturing process including fixing a semiconductor wafer by the electrostatic chuck using electrostatic force in a vacuum treatment chamber, wherein the electrostatic chuck lift pin vertically moves the semiconductor wafer, and is connected to ground in the vacuum treatment chamber so as to release residual charges (current) occurring while chucking/de-chucking the semiconductor wafer on/from the electrostatic chuck (ESC).

Advantageous Effects

In the present invention, an electrostatic chuck lift pin is made of AlTiC configured such that a TiC phase is dispersed on an $Al_2O_3$ phase and has electrical resistivity of $2.5\times10^{-5}$ to $3.5\times10$ $\Omega \cdot m$, and may thus solve defect problems caused by electrostatic and electrical reactions due to contact between components and a non-conductive ceramic material which was conventionally used.

Further, the electrostatic chuck lift pin, which is conductive, may release residual charges between a semiconductor wafer and an electrostatic chuck even in a no-plasma state, and may thus be raised immediately after de-chucking, thereby being capable of reducing a treatment time per wafer by about 5 seconds. Therefore, the conductive electrostatic chuck lift pin may greatly increase the productivity of semiconductor wafers, and does not cause an etching problem occurring in a plasma cleaning sequence when SiC is used as a material for electrostatic chuck lift pins, because the conductive electrostatic chuck lift pin according to the present invention uses Ti rather than Si.

DETAILED DESCRIPTION

A conductive electrostatic chuck lift pin according to the present invention includes AlTiC, in which a TiC phase is disposed on an $Al_2O_3$ phase.

Figure 6:
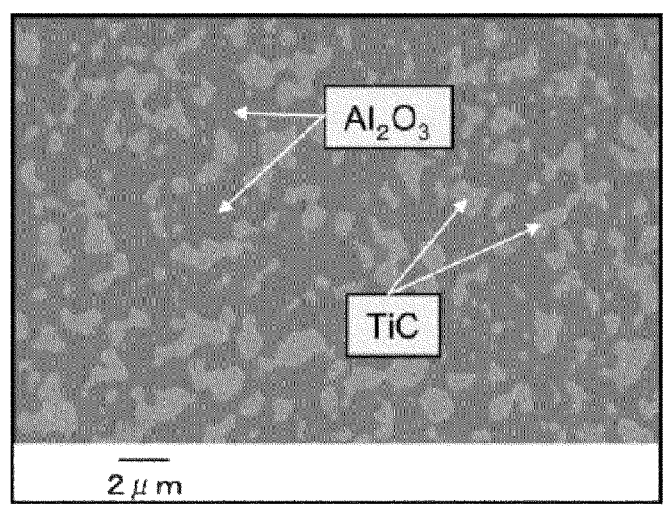
FIG. 6 is a micrograph of $Al_2O_3$—TiC (AlTiC).

AlTiC may be acquired by uniformly mixing TiC with $Al_2O_3$, and then sintering a mixture. FIG. 6 is a micrograph of one example of AlTiC acquired thereby. As shown in FIG. 6, AlTiC is provided in the form in which the TiC phase is disposed on the $Al_2O_3$ phase forming a matrix. Mixed powder of $Al_2O_3$ and TiC for sintering may include 40-80 wt % of $Al_2O_3$ powder and 20-60 wt % of TiC powder per total weight of the mixed powder. Mixed powder of TiC and $TiO_2$ may be substituted for the TiC powder. When AlTiC is formed, the electrical resistivity of AlTiC may be controlled by adjusting the amount of TiC which is mixed with $Al_2O_3$. The $Al_2O_3$ phase may include minerals other than $Al_2$ and $O_3$. The TiC phase may include small amounts of or trace amounts of minerals other than TiC. The electrical resistivity of the TiC may be controlled by adjusting the amount of C with respect to the amount of Ti.

The electrical resistivity of AlTiC used in the present invention is $2.5\times10^{-5}$ to $3.5\times10^{-5}$ $\Omega \cdot m$, and is more preferably $3\times10^{-5}$ $\Omega \cdot m$. AlTiC has both the properties of ceramics due to $Al_2O_3$ and the properties of conductors due to carbon.

The conductive electrostatic chuck lift pin including AlTiC having the above-descried electrical resistivity according to the present invention uses Ti rather than Si, and thus does not cause an etching problem occurring in the plasma cleaning sequence when SiC is used. Further, AlTiC is a conductor, and thus does not cause electrostatic and electrical reactions with an electrostatic chuck (ESC) or a wafer, and does not cause electrostatic effect when the conductive electrostatic chuck lift pin comes into contact with other components. Further, the conductive electrostatic chuck lift pin may remove residual charges (current), generated during chucking/de-chucking of a semiconductor wafer, without separate plasma discharge treatment.

Figure 2:
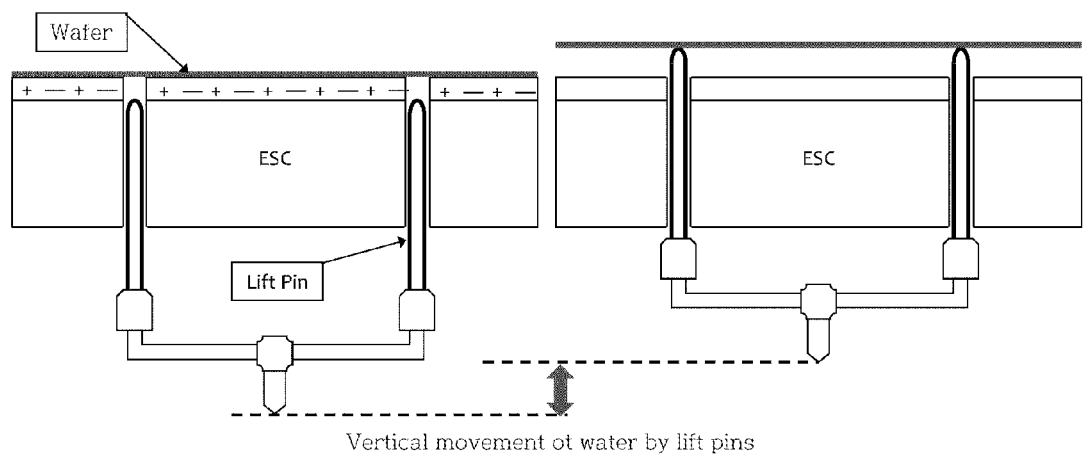
FIG. 2 is a view illustrating vertical movement of a semiconductor wafer by the electrostatic chuck lift pins.
Figure 3:
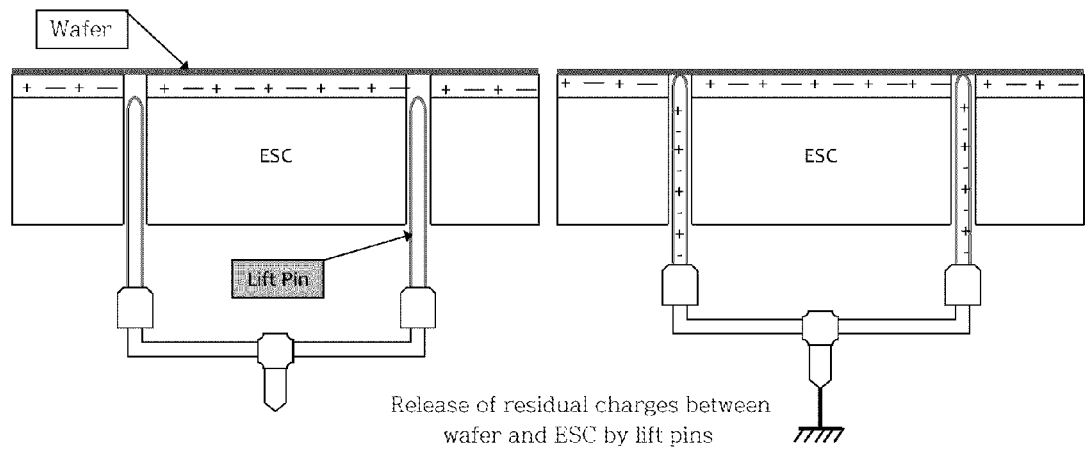
FIG. 3 is a view illustrating release of residual charges between the semiconductor wafer and an electrostatic chuck (ESC) by the lift pins.
Figure 4:
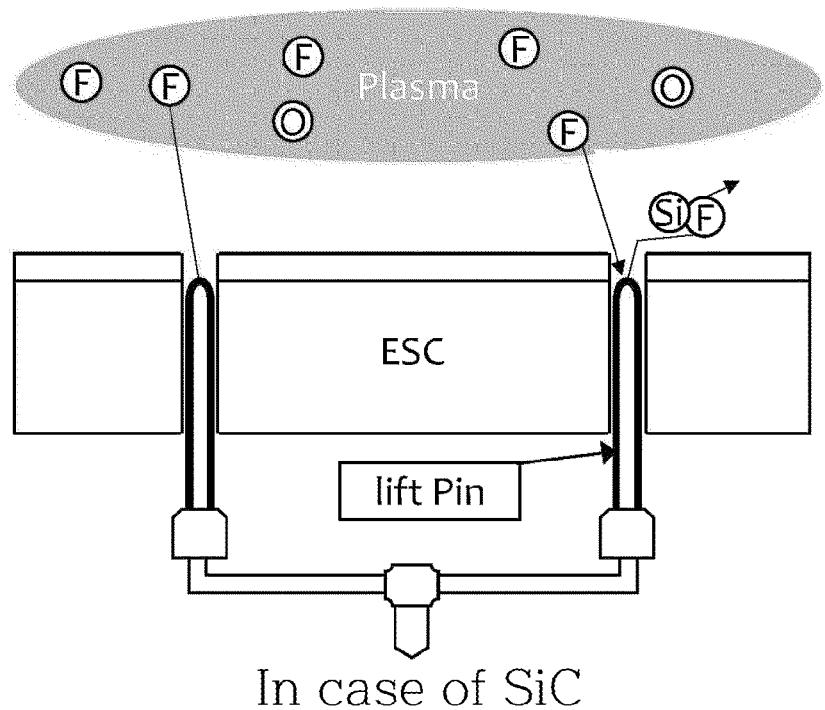
FIG. 4 is a view illustrating a problem in plasma resistance of electrostatic chuck lift pins made of SiC.
Figure 5:
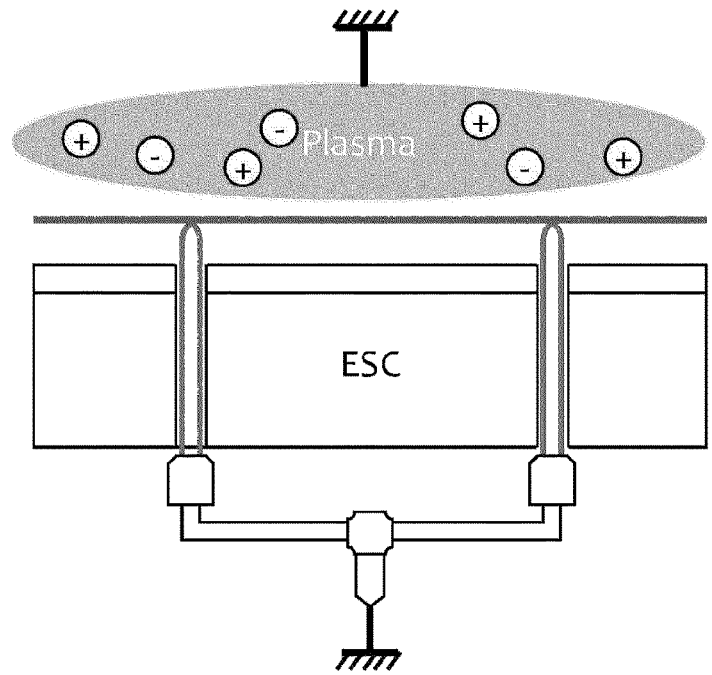
FIG. 5 is a view illustrating a problem in plasma de-chucking of electrostatic chuck lift pins made of $Al_2O_3$.

The present invention provides an electrostatic chuck in which the above-described electrostatic chuck lift pin is mounted. One or more electrostatic chuck lift pins, i.e., appropriate numbers of electrostatic chuck lift pins, are mounted in the electrostatic chuck. In general, in order to stably vertically move a wafer, three or four electrostatic chuck lift pins are mounted in the electrostatic chuck (ESC) as system components. In the present invention, the electrostatic chuck lift pins may be mounted in the electrostatic chuck by such a general method, without being limited thereto. FIG. 2 illustrates a process of vertically moving a semiconductor wafer by the lift pins mounted in the electrostatic chuck.

Further, the present invention provides a semiconductor manufacturing method using the electrostatic chuck. The semiconductor manufacturing method according to the present invention is characterized in that, in a semiconductor manufacturing process including fixing a semiconductor wafer by the electrostatic chuck using electrostatic force in a vacuum treatment chamber, the electrostatic chuck lift pins vertically move the semiconductor wafer, and are connected to ground in the vacuum treatment chamber so as to release residual charges (current) occurring while chucking/de-chucking the wafer on/from the electrostatic chuck (ESC). The residual charges occurring while chucking/de-chucking the wafer on/from the electrostatic chuck (ESC) are released by the electrostatic chuck lift pins in this way, and thus, the lift pins may be raised immediately after de-chucking without separately performing plasma discharge treatment. Therefore, a treatment time per wafer may be reduced by about 5 seconds, and thus, the productivity of semiconductor wafers may be greatly improved.

Hereinafter, the present invention will be described in more detail through the following examples. The following examples serve merely to exemplarily describe the present invention, and are not intended to limit the scope of the invention.

Example 1

Figure 1:
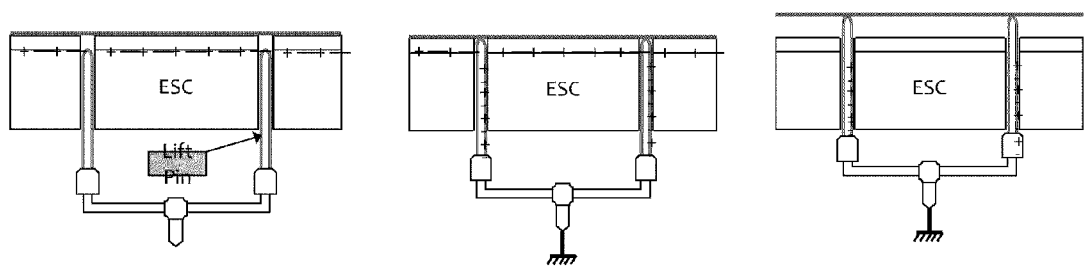
FIG. 1 is a view illustrating a no-plasma de-chucking process when electrostatic chuck lift pins made of $Al_2O_3$—TiC (AlTiC) according to the present invention are used.

De-Chucking Process Using Electrostatic Chuck Lift Pin According to Present Invention FIG. 1 is a view illustrating a no-plasma de-chucking process when the electrostatic chuck lift pins made of $Al_2O_3$—TiC (AlTiC) according to the present invention are used.

As shown in FIG. 1, when the electrostatic chuck lift pins made of $Al_2O_3$—TiC (AlTiC) according to the present invention are used, residual charges occurring between a semiconductor wafer and an electrostatic chuck may be released by the electrostatic chuck lift pins, and thus, the electrostatic chuck lift pins may be raised immediately after de-chucking.

Example 2

De-Chuck Time Depending on Material

Figure 7:
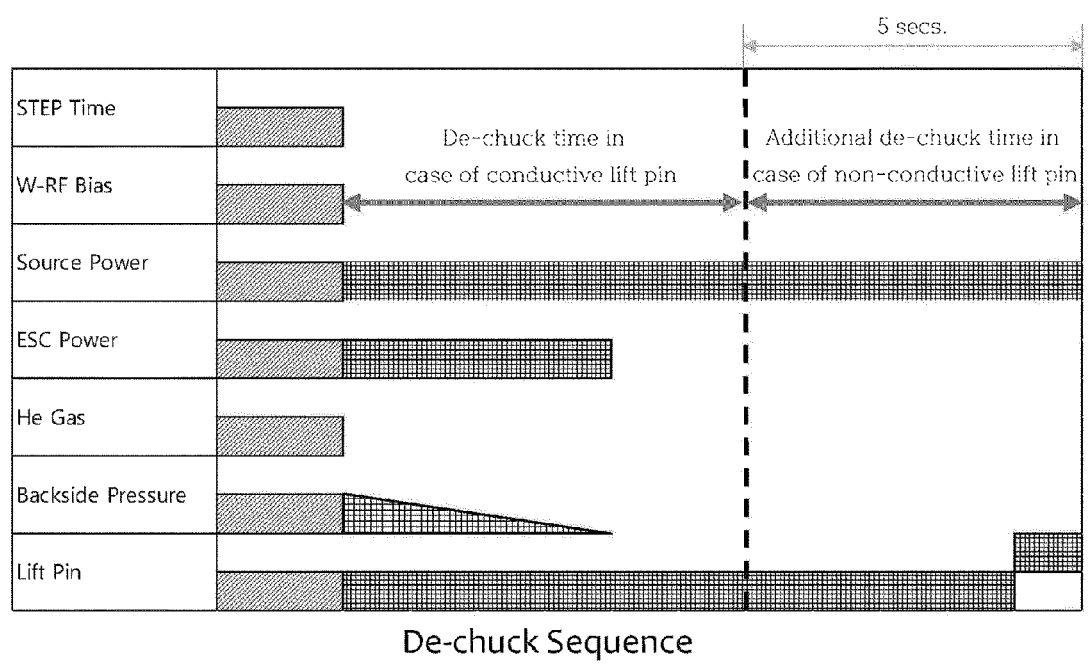
FIG. 7 is a diagram comparatively representing de-chucking sequences and treatment times when electrostatic chuck lift pins made of a conductive material are used and electrostatic chuck lift pins made of a non-conductive material are used.

FIG. 7 is a diagram comparatively representing de-chucking sequences and treatment times when electrostatic chuck lift pins made of a conductive material are used and electrostatic chuck lift pins made of a non-conductive material are used.

As shown in FIG. 7, the electrostatic chuck lift pins made of the conventional non-conductive material additionally require a time of 5 seconds for plasma de-chucking and thus negatively affect productivity, but the electrostatic chuck lift pins made of $Al_2O_3$—TiC (AlTiC), which is a conductive ceramic, according to the present invention may release residual charges even in a no-plasma state and may thus be raised immediately after de-chucking, thereby being capable of reducing a treatment time per wafer by about 5 seconds and thus greatly improving productivity.

When the treatment time per wafer is shortened by about 5 seconds, on the assumption that one system processes 48 Lots per day (24 hours) (1 day (24 hours)=48 Lots=1 System) (in case of alternate processing of 3 chambers) and 1 Lot, i.e. 1 Front Opening Unified Pod (FOUP), holds 25 wafers (1Lot=1FOUP (25 wafers)) in case of alternate processing of 3 chambers, the treatment process time of 1 Lot, which was conventionally 30 minutes, may be shortened to 28 minutes. The total treatment process time of 48 Lots per day (24 hours) was shortened by 96 minutes (1 day (24 hours)=48 Lots×2 minutes=96 minutes), and thus, about 3 Lots may be additionally treated.

On the assumption that 50 units of equipment configured to perform the same process (3 chambers per system) are in operation, 150 Lots holding wafers may be additionally treated, the same effect as addition of about 3 units of etching equipment may be exhibited, and thus, productivity may be greatly improved.

The invention claimed is:

1. A conductive electrostatic chuck lift pin comprising AlTiC configured such that a TiC phase is dispersed on an $Al_2O_3$ phase in a weight ratio of 40-80:20-60 of $Al_2O_3$:TiC, and having electrical resistivity of $2.5 \times 10^{-5}$ to $3.5 \times 10^{-5}$ Ω·m.

2. The conductive electrostatic chuck lift pin according to claim 1, wherein the electrical resistivity of the conductive electrostatic chuck lift pin is $3 \times 10^{-5}$ Ω·m.

3. The conductive electrostatic chuck lift pin according to claim 1, wherein the AlTiC is acquired by mixing 40-80 wt % of $Al_2O_3$ powder and 20-60 wt % of TiC powder and sintering mixed powder.

4. An electrostatic chuck comprising the conductive electrostatic chuck lift pin according to claim 1, mounted therein.

5. A semiconductor manufacturing process comprising fixing a semiconductor wafer by the electrostatic chuck according to claim 4 using electrostatic force in a vacuum treatment chamber, wherein the electrostatic chuck lift pin vertically moves the semiconductor wafer, and is connected to ground in the vacuum treatment chamber so as to release residual charges (current) occurring while chucking/de-chucking the semiconductor wafer on/from the electrostatic chuck.

* * * * *